United States Patent [19]

Kawata

[11] Patent Number: 5,341,309

[45] Date of Patent: Aug. 23, 1994

[54] APPARATUS FOR OPTIMIZING HIERARCHICAL CIRCUIT DATA BASE AND METHOD FOR THE APPARATUS

[75] Inventor: Tetsuro Kawata, Kanagawa, Japan

[73] Assignee: Fuji Xerox Co., Ltd., Tokyo, Japan

[21] Appl. No.: 958,714

[22] Filed: Oct. 9, 1992

[30] Foreign Application Priority Data

Oct. 11, 1991 [JP] Japan ................................. 3-290426

[51] Int. Cl.⁵ ............................................. G06F 15/60
[52] U.S. Cl. ..................................... 364/489; 364/488
[58] Field of Search ....................... 364/488, 489, 490; 395/600

[56] References Cited

U.S. PATENT DOCUMENTS 5,175,696 12/1992 Hooper et al. ..................... 364/489
5,262,959 11/1993 Chkoreff .............................. 364/489
5,267,175 11/1993 Hooper ................................ 364/489

FOREIGN PATENT DOCUMENTS 6480040 3/1989 Japan .

Primary Examiner—Vincent N. Trans
Attorney, Agent, or Firm—Finnegan, Henderson, Farabow, Garrett & Dunner

[57] ABSTRACT

A hierarchical circuit data base optimizing apparatus and a hierarchical circuit data base optimizing method which select and put out a specific partial circuit from a hierarchical circuit data base, compare the number of the interface signals found to be present between this partial circuit and the circuit module at the particular hierarchical level with the number of the interface signals found to be present between this partial circuit and another circuit module at the same hierarchical level, and renews the hierarchical structure of the circuit data base in case the latter number of the interface signals is smaller than the former number.

4 Claims, 5 Drawing Sheets

FIG. 3

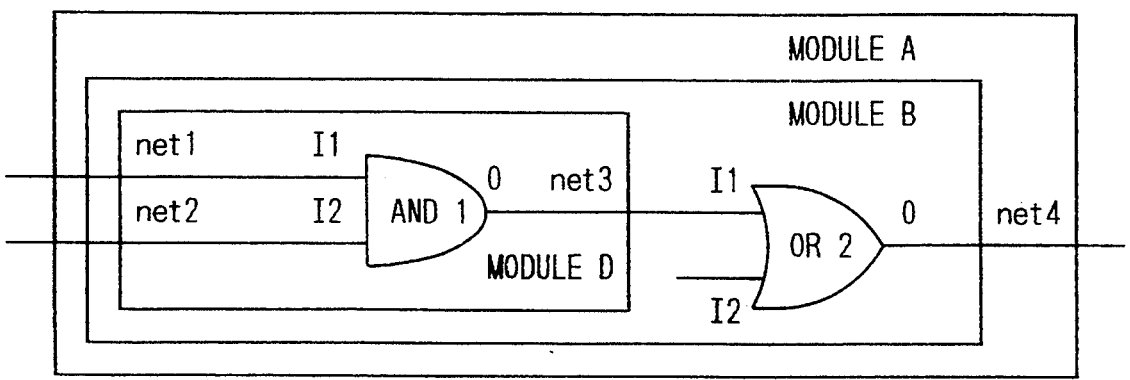

FIG. 4

```
MODULE D
    HIERARCHICAL LEVEL 2
    IN net1 net2···
    OUT net3···
    INSTANCE (AND1 and)(···)···
    WIRE net1 AND1.I1
    WIRE net2 AND1.I2
    WIRE net3 AND1.O MODULE B
    HIERARCHICAL LEVEL 1
    IN net1 net2···
    OUT net4···
    INSTANCE (D module D)(OR2 or)(···)···
    WIRE net1 D.net1
    WIRE net2 D.net2
    WIRE D.net3 OR2.I1
    WIRE net4 OR2.O MODULE A
    HIERARCHICAL LEVEL 0
    IN net1 net2···
    OUT net4···
    INSTANCE (B module B)(···)···
    WIRE net1 B.net1
    WIRE net2 B.net2
    WIRE net4 B.net4
```

APPARATUS FOR OPTIMIZING HIERARCHICAL CIRCUIT DATA BASE AND METHOD FOR THE APPARATUS

BACKGROUND OF THE INVENTION

1. Field of the Invention

The present invention relates to techniques for performing computer aided design of large scale integrated circuits and more particularly to an apparatus for a hierarchical circuit data base optimizing apparatus and a hierarchical circuit data base optimizing method, whereby information relevant to hierarchical circuits is maintained in the form of a data base for executing such design with high efficiency, in case such circuit design is to be made in a hierarchical structure, such a data base being thereby optimized.

2. Description of Related Art

Computer aided design (hereinafter referred to as "CAD") has become indispensable along with the growing complexity of design work required for large scale integrated circuits (hereinafter referred to as "LSI"), and, in fact, CAD techniques are absolutely necessary for executing the techniques generally known as "silicon compilation" and "logic synthesis" applied to the formation of layout patterns of such circuits on the basis of logical specifications for LSI.

Thus, attempts have hitherto been made, in respect of the design of LSI circuits, at performing circuit design work on LSI with ease by storing information relevant to the circuits, such as interfaces between circuits, in the form of a data base (called "circuit data base") and utilizing such a circuit data base.

Above all, such attempts have been made at automatically executing circuit design work, using such a data base, which is structured in the form of a hierarchical data base composed of information relevant to such circuits, by grasping an arrangement of such circuits and their connections in terms of a hierarchical structure, on the ground that it can thereby be made possible to achieve a reduction of the memory area for a circuit data base and to attain an improvement on the processing operations on the occasion of the execution of the circuit design on LSI. The technique for developing an arrangement of functions on an integrated circuit through utilization of such a hierarchical circuit data base has already become a publicly known technique, which is described, for example, in the Japanese Patent Unexamined Publication No. Sho. 64-80040.

However, the above-mentioned technique for designing an LSI circuit through utilization of a generally known prior art circuit data base as described above has a tendency towards an increase of the cost needed for the wiring part in the overall area of an LSI along with the enlargement of the scale of such a circuit, and there has therefore been a desire for a technique which optimizes such a circuit data base in a more efficient manner. Yet, there has been a problem that the optimization of such a data base presents difficulty.

In the meanwhile, CAD tools operating through utilization of such techniques as silicon compilation and logical synthesis are composed of abstracted statements of logics, so that designing engineers will not necessarily be able to grasp all the control signals and that such tools present difficulty in the optimization of a circuit data base in any such manner as to minimize the interface signals.

Also, the use of a hierarchical circuit data base in the conventional hierarchical structure mentioned above presents the problem that it is left entirely to the designing engineer's discretion to determine a hierarchical structure for a given circuit, with no automation having yet been accomplished for the process of determining a hierarchical structure for a circuit, also that progressive enlargements and growing complexity of such circuits have resulted in a situation in which the relations among such circuits as viewed from the standpoint of their connections in the formation of a hierarchical structure are not necessarily in any optimized condition for the purpose of minimizing the interface signals, and further that the optimizing process is difficult to perform by manual operation.

That is to say, the use of a conventional hierarchical circuit data base as mentioned above would be liable to be faced with difficulty in determining the hierarchical relations among partial circuits, or to determine the hierarchical strata to which the lower-ranking modules belong, in order to achieve the maximum reduction of the number of the interface signals among units of circuit groups.

In order to describe the above-mentioned problems more clearly, a description will be made in respect of two simple examples, with reference to drawings. FIG. 6 is a chart which illustrates the procedure for determining the hierarchical positions of a first module 20 and a second module 21.

FIG. 6 shows that the first module 20 and the second module 21 are arranged in such a manner that they will be at the same hierarchical level, and, additionally, a sub-module A22 is arranged so as to belong to the area in the first module 20, so that the sub-module A22 will be positioned at a hierarchical level directly below that of the first module 20.

Then, the Sub-module A22 has m-lines of wires for interface signals running in the direction of the inside area of the first module 20 and also has n-lines of wires for the interface signals between the Sub-module A22 and the second module 21.

If the relation, m<n, holds true in this case, the circuit construction shown in FIG. 6 will attain a reduction of the number of wires between the first module 20 and the second module 21 and will possibly attain a reduction of the wiring area as a whole with a circuit structure with the sub-module A22 is arranged inside the second module 21 as shown in FIG. 7. Such a reduction of the wiring area in the circuit construction as a whole can be accomplished because it is possible to form the wiring area between modules in a smaller size, even if the number of wires in the inside area of a module is increased, since the wiring in the inside area of a module can generally be formed in a length shorter than that of wiring between modules.

The example given in FIG. 8 illustrates a more complex case. FIG. 8, which is a drawing for illustration of a procedure for determining the hierarchical positions of three circuit modules. As shown in FIG. 8, a third module 23, a fourth module 24, and a fifth module 27 are arranged in such a way that they are positioned at the same hierarchical level, and the third module 23 includes a sub-module B25 while the fourth module 24 includes a sub-module C26.

The sub-module B25 has t-lines of wires for interface signal directed toward the inside area of the third module 23 and has p-lines of wires and r-lines of wires for interface signals, these groups of wires respectively leading towards the inside area of the sub-module C26 and the fifth module 27.

Additionally, the sub-module C26 has q-lines of wires for interface signals leading therefrom into the inside area of the fourth module 24 while it has p-lines of wires and s-lines of wires for connections thereof with the sub-module B25 and a module 27.

Now, if the relationship, $(t+q)<(p+r+s)$, holds true in this case, the circuit construction shown in FIG. 8 will be able to attain a reduction of the wiring area, for the same reason as that given in the case of the circuit construction shown in FIG. 6, when the sub-module B25 and the sub-module C26 are arranged in the inside area of the module 27, as shown in FIG. 9.

These examples merely present very simple hierarchical structures, and yet the conventional hierarchical circuit data base structure is faced with the problem that it would be an extremely difficult task to apply the technique for determining the hierarchical positions of circuit modules to all the circuits by manual operation in the manner described above because such an actual hierarchical circuit data base for an LSI will be very large in scale and very complex in structure.

SUMMARY OF THE INVENTION

The present invention has been made in consideration of the actual circumstances described above, and it is an object of the present invention to offer a hierarchical circuit data base optimizing apparatus and a hierarchical circuit data base optimizing method which are capable of making it easy to determine the hierarchical positions of the individual circuits with a hierarchical circuit data base applicable to the design of an LSI and also achieving improved efficiency in the designing procedure through optimization of such a hierarchical circuit data base.

To achieve the object, the present invention proposes a hierarchical circuit data base optimizing apparatus which performs the optimization of a hierarchical circuit data base which, being applicable to the designing of an integrated circuit, stores data relevant to the circuit modules in such a manner that a plural number of circuit modules form a circuit in a construction based on their relations in a hierarchical structure, in which the hierarchical circuit data base optimizing apparatus is characterized by comprising: a circuit dividing means, which divides, selects, and puts out the partial circuits satisfying the conditions as indicated by parameters obtained from a hierarchical circuit data base, the parameters representing the hierarchical levels of the circuit modules in the hierarchical structure mentioned above and representing also the degree of connections showing the number of connections of the interface signals in the partial circuits in a stratum lower than the hierarchical level; an interface signal counting means, which counts, as the number of the interface signals prior to the movement of the partial circuit, the number of the interface signals found to be present directly between the circuit modules at the above-mentioned hierarchical level and the above-mentioned partial circuit, which furnish the parameters serving as the reference for the selection of the above-mentioned partial circuit by the above-mentioned circuit dividing means; an interface signal comparing means, which counts, as the number of the interface signals after the movement, the number of the interface signals found to be present directly between another circuit module and the partial circuit in case the partial circuit is moved into the other circuit module having the hierarchical level and compares the number of the interface signals prior to the movement of the partial circuit and the number of the interface signals after the movement of the partial circuit; and a circuit moving means, which renews the hierarchical structure of the circuit data base in case the number of the interface signals after the movement of the partial circuit is smaller than the number of the interface signals prior to the movement of the partial circuit.

Further, the present invention proposes a hierarchical circuit data base optimizing method which performs the optimization of a hierarchical circuit data base which, being applicable to the designing of an integrated circuit, stores data relevant to the circuit modules in such a manner that a plural number of circuit modules form a circuit in a construction based on their relations in a hierarchical structure, in which the hierarchical circuit data base optimizing method is characterized by comprising the operating steps of: dividing, selecting, and putting out the partial circuits satisfying the conditions as indicated by parameters obtained from a hierarchical circuit data base, the parameters representing the hierarchical levels of the circuit modules in the hierarchical structure and representing also the degree of connections showing the number of connections of the interface signals in the partial circuits in a stratum lower than the hierarchical level; counting, as the number of the interface signals prior to the movement of the partial circuit, the number of the interface signals found to be present directly between the circuit modules at the hierarchical level and the partial circuit, which furnish the parameters serving as the reference for the selection of the partial circuit by the circuit dividing means; counting, as the number of the interface signals after the movement, the number of the interface signals found to be present directly between another circuit module and the partial circuit in case the partial circuit is moved into the other circuit module having the hierarchical level and then comparing the number of the interface signals prior to the above-mentioned movement of the partial circuit and the number of the interface signals after the movement of the partial circuit; and renewing the hierarchical structure of the circuit data base in case the number of the interface signals after the movement of the partial circuit is smaller than the number of the interface signals prior to the movement of the partial circuit.

According to the present invention, the hierarchical circuit data base optimizing apparatus is capable of achieving the optimization of a hierarchical circuit data base by forming a hierarchical structure composed of interface signals in a number reduced to the minimum attainable in respect of all the selected partial circuits since this hierarchical circuit data base optimizing apparatus is such an apparatus comprised of a circuit dividing means, which divides and selects the desired partial circuits on the basis of parameters which, being obtained from a hierarchical circuit data base, represent the hierarchical levels of the circuit modules in a hierarchical structure and the degree of connections of the partial circuits; an interface signal counting means, which counts the number of the interface signals (the number of the interface signals prior to the movement of the partial circuit) found to be present directly between the circuit modules at the circuit modules at the hierarchical level, which is taken as the reference for the selection of the partial circuit, and the selected partial circuit; an interface signal comparing means, which counts the number of the interface signals found to be present in case the selected partial circuit is moved into another circuit module at the same hierarchical level as but other than the circuit module taken as the reference for the selection (namely, the number of the interface signals present after the movement of the partial circuit) as set in contrast with the number of the interface signals prior to the movement of the selected partial circuit and then compares the number of the interface signals prior to the movement of the partial circuit with the number of the interface signals after the movement of the partial circuit; and a circuit moving means, which renews the hierarchical structure of the circuit data base in case the number of the interface signals after the movement of the partial circuit is smaller than the number of the interface signals prior to the movement of the partial circuit.

Also, according to the present invention, the hierarchical circuit data base optimizing method is capable of performing the optimization of a hierarchical circuit data base formed in a hierarchical structure composed of a number of the interface signals reduced to the minimum attainable in respect of all the selected partial circuits because this method is a hierarchical circuit data base optimizing method which comprises the operating steps of: dividing and selecting the desired partial circuits, on the basis of parameters indicating the hierarchical level and the degree of connections, from a hierarchical circuit data base in which the circuit modules are stored in a hierarchical structure; counting the number of the interface signals found to be present directly between the circuit modules at the hierarchical level taken as the reference for the selection of the partial circuits and the selected partial circuit (namely, the number of the interface signals prior to the movement of the partial circuit); counting the number of the interface signals found to be present in case the selected partial circuit is moved into the inside area of another circuit module at the same hierarchical level and yet other than the circuit module at the hierarchical level taken as the reference for the selection (namely, the number of the interface signals after the movement of the selected partial circuit) as set in contrast with the number of the interface signals prior to the movement of the partial circuit module and the partial circuit; and renewing the hierarchical structure of the circuit data base in case the number of the interface signals after the movement of the partial circuit is smaller than the number of the interface signals prior to the movement of the partial circuit.

BRIEF DESCRIPTION OF THE DRAWINGS

The manner by which the above objects and other objects, features and advantages of the present invention are attained will be fully evident from the following detailed description when it is considered in light of the drawings, wherein:

FIG. 3 is a chart illustrating a part of a specific circuit having a hierarchical structure;

FIG. 4 is a chart illustrating a part of a hierarchical net list shown in FIG. 3;

DETAILED DESCRIPTION OF THE PREFERRED EMBODIMENTS

Now, a description will be made of an example of preferred embodiment of the present invention with reference to the accompanying drawings, in which like reference marks designate like or corresponding parts throughout the several drawings.

In the description to follow, some embodiment of the present invention will be used as examples. It should be understood, however, that the present invention is not limited to these examples of its embodiments, but may be applied effectively to other forms of its embodiment to such an extent as will not deviate from the technical scope defined for the present invention.

In this regard, it is noted that the optimizing process in the hierarchical circuit data base optimizing apparatus and the hierarchical circuit data base optimizing method as described in this example of embodiment of the present invention is not an optimization in the strict sense of the term, but a conversion performed locally in order to obtain the relatively optimum output.

The hierarchical circuit data base optimizing apparatus described in this example of embodiment is constructed with a conventional computer system which processes a data base, and the processing operations performed by this computer system consist of: a circuit dividing step, at which the system takes in divided parts, selects, and puts out those partial circuits which are not less than the hierarchical level M+1 from a hierarchical circuit data base on the basis of two parameters, namely, a parameter indicating the hierarchical level M and a parameter indicating the degree of connection N (i.e., the number of nodes), both of which will be described later; an interface (I/F) signal counting step, at which the system counts the number of the interface signals (CSIF) between the module at the hierarchical level M, which is taken as the reference for the selection of the partial circuits at the circuit dividing step, and the partial circuits to be connected directly with the particular module just mentioned; an interface (I/F) signal comparing step, at which the system counts the number of the direct interface signals (CND.IF) found to be present between another module and the partial circuits in case the divided and selected partial circuits are moved into the particular other module having this number of interface signals (CSIF) and positioned at the hierarchical level M and then comparing the number of the signals CSIF with the number of the signals CND.IF; and a circuit moving step, at which the system renews the hierarchical structure of the hierarchical circuit data base in case the relationship, the number of signals CSIF>the number of signals CND.IF, holds true.

Figure 1:
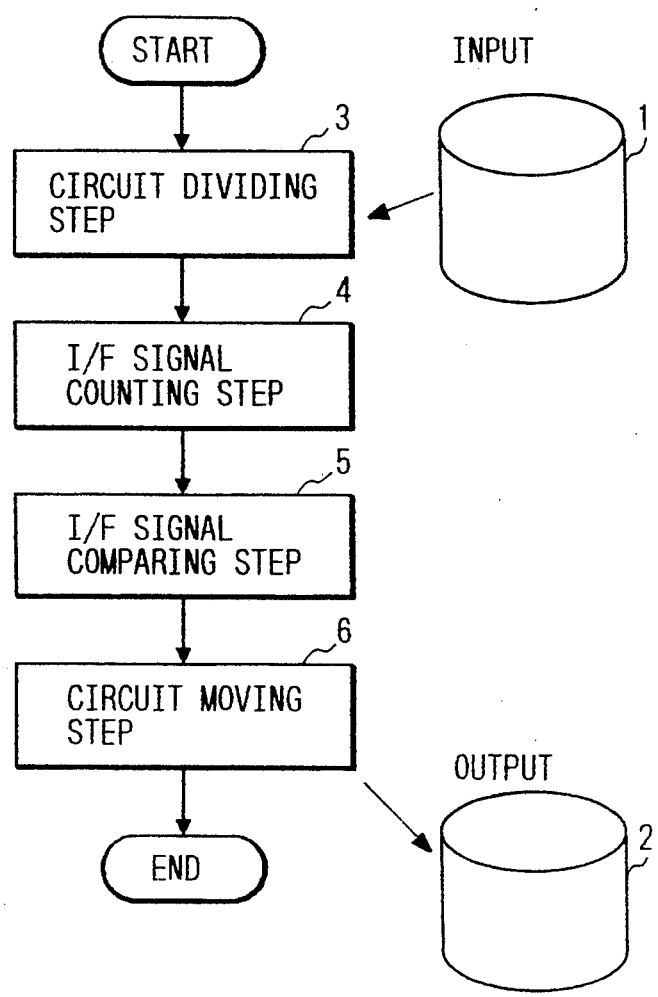
FIG. 1 is a flow chart illustrating the hierarchical circuit data base optimizing method described in an example of preferred embodiment of the present invention.

FIG. 1 presents a flow chart illustrating the operating procedure for practicing the hierarchical circuit data base optimizing method with the hierarchical circuit data base optimizing apparatus in embodiment of the present invention. In FIG. 1, the hierarchical circuit data base 1 is a data base in its state prior to the application of the hierarchical circuit data base optimizing method described in this example of preferred embodiment, and the hierarchical circuit data base 2 is the data base in its state as optimized by the hierarchical circuit data base optimizing method described in this example of embodiment.

Now, a description will be made of the individual steps taken in the execution of the hierarchical circuit data base optimizing method with the hierarchical circuit data base optimizing apparatus described in this example of embodiment. At the circuit dividing step 3, the system divides, selects, and puts out those partial circuits which are respectively at a level not lower than the hierarchical level M+1, which satisfies the conditions indicated by the applicable parameters, from a hierarchical circuit data base 1 on the basis of the two parameters respectively indicating the hierarchical level M and the degree of connection (i.e., the number of nodes) N, both of which will be described later. At the interface (I/F) signal counting step 4, the system counts the number of the interface signals (CSIF) found to be present directly between the partial circuits selected at the circuit dividing step 3 and the module at the hierarchical level M, which is taken as the reference for the selection of the particular partial circuits. At the interface (I/F) signal comparing step 5, the system compares the number of the interface signals (CSIF) with the number of interface signals (CND.IF) which are found to be present directly between another module at the hierarchical level M and the partial circuits in case the selected partial circuits are moved into the particular other module which is at the hierarchical level M and yet different from the module which is positioned at the hierarchical level M and taken as the reference for the above-mentioned selection of the partial circuits. At the circuit moving step 6, the system renews the hierarchical structure of the hierarchical circuit data base in case it finds that the relationship, (the number of the signals CSIF)>(the number of the signals CND.IF), holds true.

Figure 2:
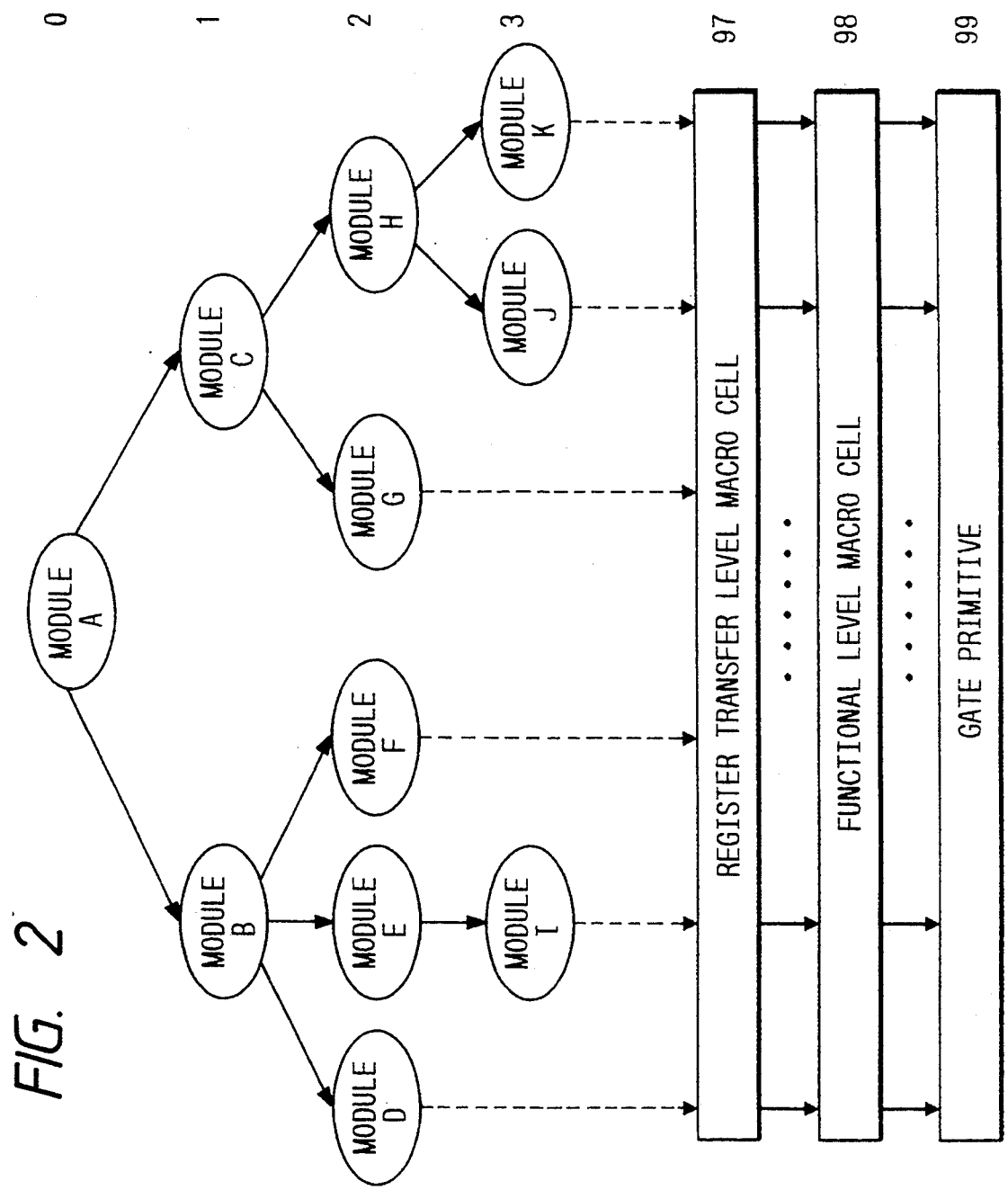
FIG. 2 is a chart illustrating an example of the hierarchical structure of a hierarchical circuit data base.

Before a description is made of the details of the hierarchical circuit data base optimizing method described in this example of embodiment of the present invention, the concept of a hierarchical circuit data base to which the hierarchical circuit data base optimizing method described in this example of embodiment is to be applied will be described with reference to FIG. 2, which shows a specific example of such a data base. FIG. 2 is a Chart showing an example of the hierarchical structure of a hierarchical circuit data base.

The hierarchical structure of a circuit data base can be expressed in a directed line graph, which shows the nodes representing the circuit unit called "module" and the edges representing the relations of inclusions of modules. Here, modules are divided between non-terminating modules, which include other modules in themselves, and terminating modules, which do not include any other module in themselves.

Now, a specific description will be made with reference to FIG. 2. The modules A, B, C, and D are non-terminating modules while the modules D, I, F, G, J, and K are terminating modules. The terminating modules are formed in such a manner as necessarily to include at least one out of a register transfer level macro cell, a functional level macro cell, and a gate primitive. Moreover, the non-terminating modules may include any of a register transfer level macro cell, a functional level macro cell, and a gate primitive.

In this regard, a gate primitive is a minimum unit for the formation of any such circuits as a NAND gate, an inverter, and a transistor, and a functional level macro cell is composed of such cells as a full adder and a latch and formed by a gate primitive. Moreover, a register transfer level macro cell furnishes a circuit model at the register transfer level for a register, an ALU, and the like and is formed by a functional level macro cell or a gate primitive.

Each module has hierarchical levels equivalent to the number of edges present in the range starting from the root module and reaching the particular module. For instance, the module A has no hierarchical level, the module E has two hierarchical levels, and the module I has three hierarchical levels, and these modules have their respective hierarchical levels, as shown in FIG. 2. Particularly, the modules are formed in such a manner that a register transfer level macro cell has 97 hierarchical levels, a functional level macro cell has 98 hierarchical levels, and a gate primitive has 99 hierarchical levels.

Next, a description will be made of the data contents of a hierarchical circuit data base as viewed with reference to the accompanying drawings, FIG. 3 and FIG. 4.

FIG. 3 is a chart showing a part of a specific circuit having a hierarchical structure, and FIG. 4 is a chart showing a part of a hierarchical net list corresponding to the circuit shown in FIG. 3.

The hierarchical net list is a set of data forming a principal part of a hierarchical circuit data base and is composed of a collection of net lists corresponding to all the kinds of the individual modules forming the circuits, the functional level macro instructions, and the functional level macro cells. Above all, the hierarchical net list is organized in such a manner that it consists of only one net list for the same kinds of modules, functional macro instructions, and functional level macro cells, this feature being one of the characteristics of the hierarchical net list.

As shown in FIG. 4, the individual net lists start with the names indicating the kinds of the modules, the functional level macro instructions, or the functional level macro cells and the subsequent part of such a net list is composed of an input signal description block, which contains a description of the names of the input signals (IN), an output signal description block, which contains a description of the names of the output signals (OUT), an instance description block, which contains the names expressing the kinds of the instances (instance: individual names given to the modules, the functional level macro instructions, the functional level macro cells, and the primitives), namely, the names expressing the kinds of the modules, the functional level macro instructions, the functional level macro cells, and the primitives, which are used in the inside area of a module, and a connection description block, which expresses the connections for inputs and outputs of the input and output signals, the internal signals, the inputs and outputs of the instances.

The data construction in the hierarchical circuit data base described above is constructed in such a manner that it furnishes the data necessary for the hierarchical circuit data base optimizing method described in this example of preferred embodiment of the present invention.

Next, a description will be made of the operating procedure followed for the execution of the hierarchical circuit data base optimizing method with the hierarchical circuit data base optimizing apparatus described in this example of preferred embodiment. As shown in FIG. 1, the hierarchical circuit data base optimizing method described in this example of preferred embodiment are composed of the individual steps, namely, a circuit dividing step 3, an interface (I/F) signal counting step 4, an interface (I/F) signal comparing step 5, and a circuit moving step 6, and, in the subsequent part, a description will be made of the particulars of the processing operations performed at each of these individual steps.

The circuit dividing step 3 serves as a means of selecting those partial circuits, which are to be taken up as the objects of the optimizing operations, out of a hierarchical circuit data base, which is put into the system. In general, the number of the partial circuits in case such partial circuits are selected out of a hierarchical circuit data base will increase at a ratio as determined by a certain exponential function in relation to the scale of the circuit, and it is therefore not possible for any practical purpose to select the partial circuits in all the combinations thereof.

Figure 5A:
FIGS. 5($a$) and 5($b$) are charts illustrating two circuit forms each composed of an instance at the degree 3 of connection.
Figure 5B:
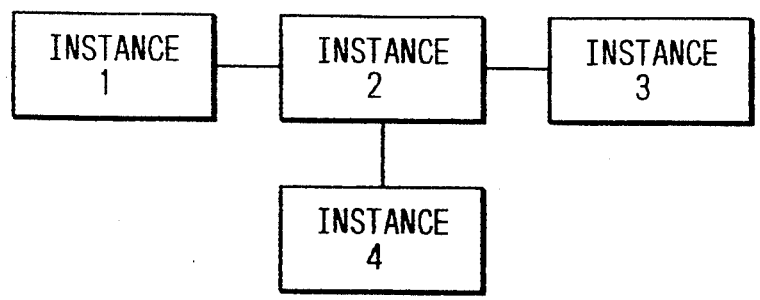

Then, as the reference or criterion for the selection of partial circuits, the present invention introduces the two parameters, namely, the hierarchical level M and the degree of connection N. Here, the hierarchical level M means the hierarchical level which is held by each of the instances (namely, the individual names given to the modules, the functional level macro instructions, the functional level macro cells, and the primitives) of the hierarchical circuit data base 1 put into the system. Moreover, the degree of connection N means connections formed of N-lines of signal wires, and, particularly, a group of instances at the degree of connection N means a group of instances which are to be connected by N-lines of signal wires from a given instance in the hierarchical circuit data base 1. For example, two forms of circuits each comprised of instances at the third degree of connection are shown in FIG. 5(a) and FIG. 5(b), respectively.

When the hierarchical level M and the degree of connection N are given to the circuit dividing step 3, the circuit dividing step 3 selects and puts out those groups (partial groups) having the degree of connection N out of all the instances of the modules, the register transfer level macro cells, the functional level macro cells, and the gate primitives which have a hierarchical level value at least equal to the hierarchical level (M+1) in relation to those modules at the hierarchical level M. Therefore, the individual partial groups may be put out in some cases in correspondence with a plural number of modules at the hierarchical level M. At such a time, however, the hierarchical structure is formed in such a manner that it prohibits the co-existence of the instances, such as modules, in a value not lower than the hierarchical level (M+1) in the same partial group in case they are in a mutually inclusive relation. For example, a processing step will be taken so as to ignore one of the instances in their mutually inclusive relation.

In order to attain a higher level of efficiency in the processing operations for the above-mentioned selection of partial circuits, the circuit dividing step is designed so as to select and to put out only those partial groups of the instances which extend over a plural number of modules at a hierarchical level not any higher than the level M, tracing back specifically from the input signals and the output signals of the net list for the modules at the hierarchical level M using as a clue the number of wires for the interface signals for the modules at or below the hierarchical level M in the process of selecting the partial groups mentioned above. That is to say, the optimizing operations will thus be performed on those modules the hierarchical level of which is M, and it is therefore not necessary to put out any group of instances all the elements of which belong to the inside area of the same module at the hierarchical level M.

The interface (I/F) signal counting step 4 counts the number of lines of signals of the direct interface signals (input signals and output signals)(hereinafter called "the number of the signals CSIF) of the modules at the hierarchical level M out of all the signal lines attending the partial groups with respect to the partial groups of all the instances obtained in a hierarchical circuit data base at the circuit dividing step 3.

Figure 6:
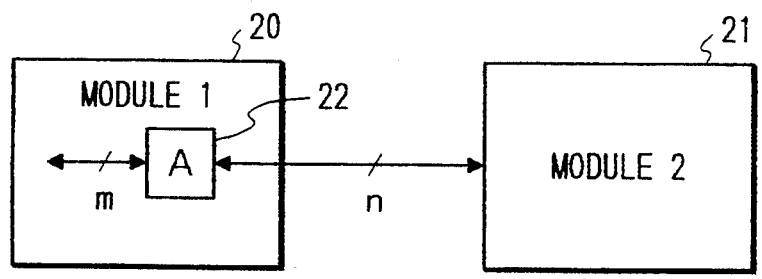
FIG. 6 is a chart for illustrating a description of the procedure for determining the hierarchical positions of two circuit modules.
Figure 8:
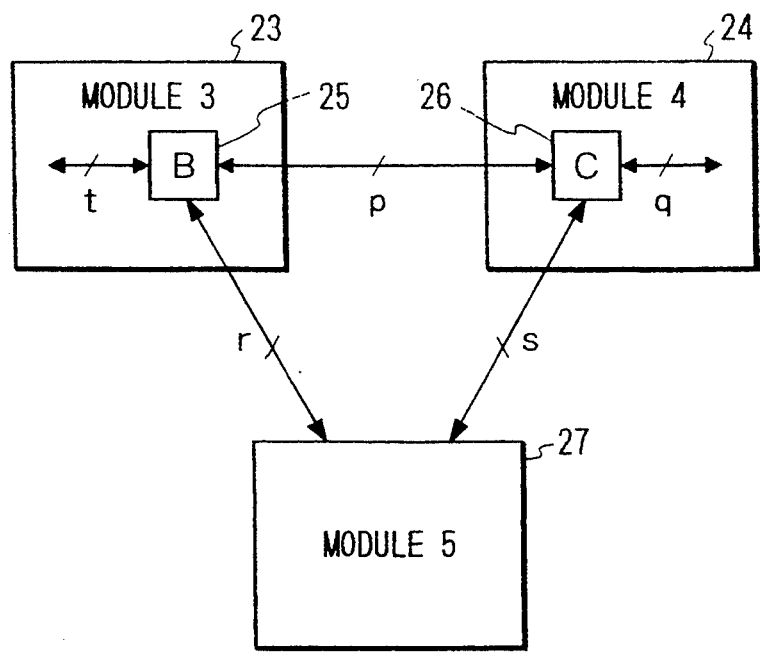
FIG. 8 is a chart for illustrating a description of the procedure for determining the hierarchical positions of three circuit modules.

In the example shown in FIG. 6, the number of the signals CSIF in the partial group {A} of the instances will be n when it is assumed that the first module 20 has a hierarchical level M. Also, in the example given in FIG. 8, the number of the signals CSIF of the partial groups {B} and {C} of the instances will be (p+r+s) when it is assumed that the third module 23 and the fourth module 24 respectively have the hierarchical level M. The interface (I/F) signal counting step 4 puts out a group or groups in respect of a set of two elements (namely, a group of instances or [a partial group of instances] and the number of the signal lines CSIF for the partial group of instances).

The interface signal comparing step 5 receives the input of the sets of two elements obtained at the interface (I/F) signal counting step 4 and performs the following operations 1 through 3 on each of the sets of two elements (namely, a group of instances and the number of the signal lines CSIF).

In the operation 1 of the interface (I/F) signal comparing step 5, all the modules having the hierarchical level M are selected as candidates out of the modules contained in the hierarchical circuit data base 1.

In the operation 2 of the interface (I/F) signal comparing step 5, the number of the interface signals which represent the relations of connections which will be formed between the candidate module and the instances in the group (Such an interface signal will be called "the signal CND.IF" in the subsequent part) in case all the groups of instances taken up currently are moved into the inside area of the candidate module is counted with respect to each of the candidate modules selected in the operation 1.

Figure 7:
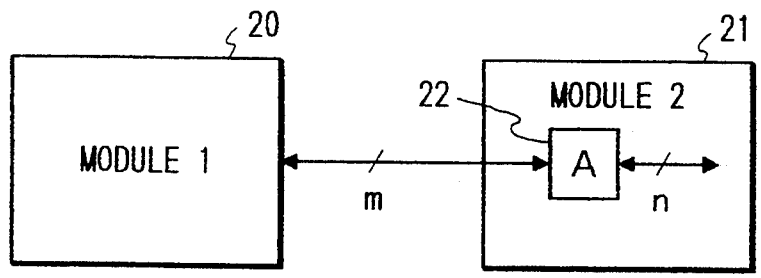
FIG. 7 is a chart illustrating a case in which the circuit construction shown in FIG. 6 has been optimized.
Figure 9:
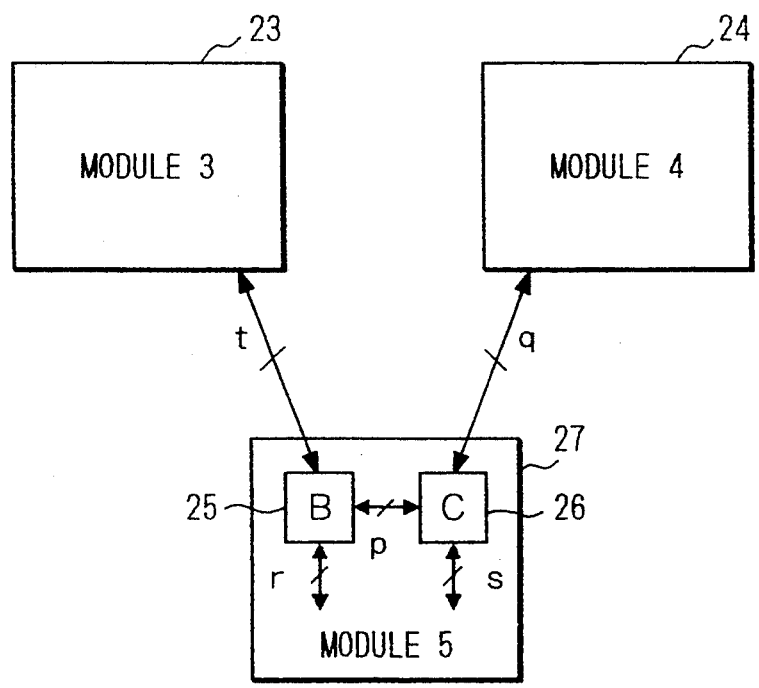
FIG. 9 is a chart for illustrating a description of a case in which the circuit construction shown in FIG. 8 has been optimized.

Now, consideration is given, for example, to the example given in FIG. 7, in which the sub-module A22 is moved into the second module 21, the number of the signals CND.IF becomes m as the result of the movement of the partial group {A} of the instances into the second module 21 at the hierarchical level M. Moreover, the case in which the sub-modules B25 and C26 are moved into the module 27 is considered with reference to the example given in FIG. 9, and it is found that the number of the signals CND.IF becomes (t +q) as the result of the movement of the partial groups of instances {B} and {C} into the fifth module 27 at the hierarchical level M.

In the operation 3 at the interface (I/F) signal comparing step 5, the number of the signals CSIF counted at the interface (I/F) signal counting step 4 and received as an input is compared with the number of the signals CND.IF found as the result of the operation 2, and, in case the number of the signals CND.IF is smaller than the number of the signals CSIF (i.e., the relation, the number of the signals CSIF>the number of the signals CND.IF, holds true), the number of the signals CND.IF and the module which is to be the destination of the movement of the group of instances are recorded. The module which is the destination of the movement of the group of instances is the module into which the group of instances is to be moved.

At the interface (I/F) signal comparing step 5, a group of signals relating to a set of the four elements obtained by the procedure from the operation 1 to the operation 3 (namely, the group of instances, the number of the signal lines CSIF, the module which is the destination of the movement of the instances, and the number of the signals CND.IF) will be put out.

The circuit moving step 6 operates with a means of making renewals of the hierarchical circuit data base on the basis of a group regarding the set of the four elements received as an input (namely, the group of instances, the number of the signal lines CSIF, the module which is the destination of the movement of the instances, and the number of the signals CND.IF). In other words, this renewing operation means an operation for rewriting the hierarchical structure of the hierarchical circuit data base to a new set of structural relations by establishing the relations of the group of instances for their inclusion in the inside area of the candidate module with respect to a case in which the relationship, the number of the signal lines CSIF>the number of the signals CND.IF, holds true in case the group of instances is moved into the inside area of the candidate module by the operation 2 at the interface (I/F) signal comparing step 5. That is to say, this renewing operation means an operation for removing the moved instances from the old module into a new module.

Then, an operation for rewriting the contents of the relevant net list is performed on the basis of the hierarchical structure of the module or the like the relation of which is thus newly established, and a renewal is thereby made of the hierarchical circuit data base.

One point which calls for careful attention in this regard is the fact that output not suitable for the purpose of optimization may be produced in case two or more sets of the four elements including the same instance are applied. Accordingly, the sets which will be applicable out of the sets of the four elements received as input are only those sets which do not have any overlapping of the respective instances in the sets of the four elements. If there is any case in which the instances of the set of the four elements are in any overlapping, it will be possible to achieve the maximum effect of the application of the instances by selecting the set of four elements which produces the largest difference between the number of the signal lines CSIF and the number of the signals CND.IF.

It goes without saying that it will be possible to apply a different hierarchical level and a different degree of connection to the hierarchical circuit data base optimizing method described in this example of preferred embodiment. In such a case, the hierarchical circuit data base optimizing method described in this example of preferred embodiment may be applied, with changes made in the hierarchical level or in the degree of connection which are fed as parameters into the system.

With the hierarchical circuit data base optimizing apparatus and the hierarchical circuit data base optimizing method which are respectively described in this example of preferred embodiment, it is possible to produce the effect that a higher speed can be attained in the designing process applied to the designed data on circuits formed in a hierarchical structure in representation of the logic specifications of an LSI through automation realized in the working procedure for determining the hierarchical levels of partial circuits, or the hierarchical levels to which lower-ranking circuit modules belong, in such a manner that the number of the interface signals between groups of circuit modules which belong to a given hierarchical level will be reduced to the minimum number ever attainable.

Moreover, while the conventional procedure for determining a hierarchical structure for a hierarchical circuit data base has hitherto been executed by designers in such a manner as to form the optimum hierarchical structure on an empirical basis. However, with the method and apparatus described in this example of embodiment, it is possible to produce the effect that a hierarchical circuit data base can be produced in a further optimized state since the hierarchical circuit data base optimizing apparatus and method are capable of examining as many combinations of partial circuits as possible in such a manner as to reduce the number of the interface signals to the minimum attainable by effectively taking the circuit dividing step 3, the interface (I/F) signal counting step 4, the interface (I/F) signal comparing step 5, and the circuit moving step 6, which together form the optimizing method.

Furthermore, the hierarchical circuit data base optimizing method described in this example of embodiment produces the effect that the output can be obtained at a higher speed because the number of the modules and so forth to be processed can be limited to a certain extent by the effect of the input of the hierarchical level and the degree of connection as the parameters.

As described above, according to the present invention, the hierarchical circuit data base optimizing apparatus is capable of producing the advantageous effect that it can achieve the optimization of a hierarchical circuit data base by forming a hierarchical structure composed of interface signals in a number reduced to the minimum attainable in respect of all the selected partial circuits because this hierarchical circuit data base optimizing apparatus is an apparatus comprised of a circuit dividing means, which divides and selects the desired partial circuits on the basis of parameters which, being obtained from a hierarchical circuit data base in which the circuit modules are stored in a hierarchical structure, represent a hierarchical level and the degree of connections; an interface signal counting means, which counts the number of the interface signals (namely, the number of the interface signals prior to the movement of the partial circuits) found to be present directly between the circuit module at the hierarchical level which is taken as the reference for the selection of the partial circuits, and the selected partial circuits; an interface signal comparing means, which counts the number of the interface signals found to be present in case the selected partial circuits are moved into another circuit module which is at the same hierarchical level as but other than the circuit module taken as the reference for the selection of the partial circuits (namely, the number of the interface signals present after the movement of the partial circuits) as set in contrast with the number of the interface signals found to be present prior to the movement of the selected partial circuits and then compares the number of the interface signals prior to the movement of the partial circuits with the number of the interface signals after the movement of the partial circuits; and a circuit moving means, which renews the hierarchical structure of the circuit data base in case the number of the interface signals after the movement of the partial circuits is smaller than the number of the interface signals prior to the movement of the partial circuits.

Further, according to the present invention, the hierarchical circuit data base optimizing method is capable of producing the advantageous effect that it can perform the optimization of a hierarchical circuit data base formed in a hierarchical structure composed of a number of the interface signals reduced to the minimum attainable in respect of all the selected partial circuits because this method is a hierarchical circuit data base optimizing method which comprises the operating steps of: dividing and selecting the desired partial circuits, on the basis of parameters indicating the hierarchical level and the degree of connection, from a hierarchical circuit data base in which the circuit modules are stored in a hierarchical structure; counting the number of the interface signals found to be present directly between the circuit modules at the hierarchical level taken as the reference for the selection of the partial circuits and the selected partial circuits (namely, the number of the interface signals found to be present prior to the movement of the partial circuits); counting the number of the interface signals found to be present in case the selected partial circuits are moved into the inside area of another circuit module which is at the same hierarchical level and yet other than the circuit module at the hierarchical level taken as the reference for the selection mentioned above (namely, the number of the interface signals after the movement of the selected partial circuits) as set in contrast with the number of the interface signals found to be present prior to the movement of the partial circuits and then comparing the number of the interface signals found prior to the movement of the partial circuits with the number of the interface signals found to be present after the movement of the partial circuits; and renewing the hierarchical structure of the circuit data base in case the number of the interface signals after the movement of the partial circuit is smaller than the number of the interface signals prior to the movement of the partial circuit.

What is claimed is:

1. A device for optimizing a hierarchical circuit data base which stores data relevant to a plurality of circuit modules having a hierarchical structure, said apparatus comprising:

means for selecting partial circuits satisfying conditions as indicated by parameters obtained from said hierarchical circuit data base, said parameters representing a hierarchical level of the circuit modules and the degree of connection indicating the number of connections of interface signals in the partial circuits in a stratum lower than the hierarchical level;

means for counting, as the number of the interface signals prior to the movement of the partial circuits, the number of the interface signals found to be present directly between the circuit modules at the hierarchical level and the partial circuits, both of which furnish the parameters serving as the reference for the selection of said partial circuit by selecting means;

interface signal comparing means, which counts, as the number of the interface signals after the movement, the number of the interface signals found to be present directly between another circuit module at the hierarchical level and the partial circuit in case said partial circuit is moved into said other circuit module at said hierarchical level, the number of the interface signals present after the movement of said partial circuit being set in contrast with the number of the interface signals found to be present prior to the movement of said partial circuit, to compare the number of the interface signals found to be present prior to the movement of the partial circuit with the number of the interface signals found to be present after said movement of the partial circuit; and renewing means, for renewing the hierarchical structure of the hierarchical circuit data base in case the number of the interface signals found to be present after the movement of the partial circuit is smaller than the number of the interface signals found to be present prior to said movement of the partial circuit.

2. A device as claimed in claim 1, wherein said hierarchical circuit data base comprises an integrated circuit.

3. A method of optimizing a hierarchical circuit data base which stores data relevant to the a plurality of circuit modules a hierarchical structure, said method comprising the steps of:

selecting partial circuits satisfying conditions as indicated by parameters obtained from a hierarchical circuit data base, the parameters representing the hierarchical levels of the circuit modules in the hierarchical structure and the degree of connection indicating the number of connections of the interface signals in the partial circuits in a stratum lower than the hierarchical level defined above;

counting, as the number of the interface signals prior to the movement of the partial circuit, the number of the interface signals found to be present directly between the circuit modules at the hierarchical level and the partial circuit, both of which furnish the parameters serving as the reference for the selection of said partial circuit by the selecting step;

counting, as the number of the interface signals after the movement, the number of the interface signals found to be present directly between another circuit module and the partial circuit in case said partial circuit is moved into said other circuit module positioned at the hierarchical level and then comparing the number of the interface signals prior to the movement of the partial circuit with the number of the interface signals after said movement of the partial circuit; and renewing the hierarchical structure of the circuit data base in case the number of the interface signals after the movement of the partial circuit as defined above is smaller than the number of the interface signals prior to the movement of the partial circuit.

4. A method as claimed in claim 3, wherein said hierarchical circuit data base comprises an integrated circuit.

* * * * *

UNITED STATES PATENT AND TRADEMARK OFFICE
CERTIFICATE OF CORRECTION

PATENT NO. : 5,341,309
DATED : August 23, 1994
INVENTOR(S) : Tetsuro KAWATA

It is certified that error appears in the above-indentified patent and that said Letters Patent is hereby corrected as shown below:

Claim 3, Column 14, Line 32 before " a plurality " delete "the".

Signed and Sealed this

Eleventh Day of April, 1995

Attest:

BRUCE LEHMAN

*Attesting Officer*  *Commissioner of Patents and Trademarks*